(12) United States Patent
Jung et al.

(10) Patent No.: US 12,271,771 B2
(45) Date of Patent: Apr. 8, 2025

(54) FREQUENCY SELECTIVE SECURITY PAPER AND METHOD FOR MANUFACTURING THE SAME

(71) Applicant: POSI INC., Seoul (KR)

(72) Inventors: Yu Suk Jung, Seoul (KR); Jae Hong Jung, Seoul (KR); Chang Jin Lee, Yongin-si (KR)

(73) Assignee: POSI INC., Seoul (KR)

( * ) Notice: Subject to any disclaimer, the term of this patent is extended or adjusted under 35 U.S.C. 154(b) by 0 days.

(21) Appl. No.: 18/208,320

(22) Filed: Jun. 12, 2023

(65) Prior Publication Data

US 2024/0086669 A1 Mar. 14, 2024

(30) Foreign Application Priority Data

Sep. 8, 2022 (KR) .......... 10-2022-0114145

(51) Int. Cl.
| | | |
|---|---|---|
| *G06K 19/00* | (2006.01) | |
| *G06K 19/02* | (2006.01) | |
| *H01F 27/28* | (2006.01) | |
| *H03H 7/00* | (2006.01) | |

(52) U.S. Cl.
CPC ....... *G06K 19/025* (2013.01); *H01F 27/2804* (2013.01); *H03H 7/00* (2013.01)

(58) Field of Classification Search
CPC ..... G06K 19/025; H01F 27/2804; H03H 7/00
USPC .......................................................... 235/494
See application file for complete search history.

(56) References Cited

U.S. PATENT DOCUMENTS

2023/0068929 A1* 3/2023 Forster .............. G08B 13/2417

FOREIGN PATENT DOCUMENTS

| JP | 2005-525255 A | 8/2005 |
|---|---|---|
| JP | 2015-114213 A | 6/2015 |
| KR | 10-2016-0005871 A | 1/2016 |
| KR | 10-1743823 B1 | 6/2017 |
| KR | 10-1775526 B1 | 9/2017 |

* cited by examiner

*Primary Examiner* — Daniel A Hess
(74) *Attorney, Agent, or Firm* — Revolution IP, PLLC (57) ABSTRACT

The present invention relates to a frequency selective security paper and a method for manufacturing the same. The frequency selective security paper according to an exemplary embodiment of the present invention may include: a drafting paper for forming a paper; a frequency resonator formed on one surface of the drafting paper and formed in a form of a meandering line or a capacitor so as to resonate to a designated frequency when passing through a security search device; and a coating liquid including the frequency resonator therein and formed on the drafting paper.

7 Claims, 6 Drawing Sheets

FREQUENCY SELECTIVE SECURITY PAPER AND METHOD FOR MANUFACTURING THE SAME

CROSS-REFERENCE TO RELATED APPLICATION

This application claims under 35 U.S.C. § 119(a) the benefit of Korean Patent Application Nos. 10-2022-0114145 filed on 2022 Sep. 8, the entire contents of which are incorporated herein by reference.

BACKGROUND

(a) Technical Field

The present invention relates to a frequency selective security paper and a method for manufacturing the same, and more particularly, to a frequency selective security paper including a meandering line or a frequency resonator of a capacitor so that a nation or a company may select and use a unique frequency paper suitable therefor in order to maintain the full security of a security paper, and a manufacturing method of the security paper.

(b) Background Art

As the importance of information is recently emphasized, the need and interest in the security of the information are also increasing day by day. As a result, security technologies that control the export of various storage media are also developing, and as the need to control the export of the printed documents increases, there is an attempt to prevent the export by attaching a detection tag to the security document. In other words, a detection gate is installed at the entrance, and when the document with the detection tag passes through the detection gate, the document is detected to provide an alarm signal, thereby preventing the export. The technology is currently used to prevent various books and documents from being exported without permission from libraries and companies.

In addition, conventionally, in order to supplement documents, large companies, etc., are equipped with amorphous on paper and output only combined documents to prevent document leakage when passing through a security gate, i.e., an inspection table. However, this is expensive, and there is a problem in that amorphous is displayed in the combined paper. In order to improve the problem, amorphous is crushed and applied to the paper jointly with a binder, and a thin paper is manufactured at a level at which amorphous is slightly viewed, but when the paper is output, letters are broken and a text quality is low.

By further improving this, amorphous is further crushed and used in the related art, and in this case, a resonance frequency of a security gate which sends and receives a signal to and from amorphous is common worldwide. For this reason, there is also a problem of purchasing a paper with amorphous from the outside, holding frequency blocking materials on both sides of the paper, entering the company, outputting information, and leaking technology security when leaving work.

PRIOR ART DOCUMENTS

Patent Documents (Patent Document 1) Korean Patent Publication No. 10-1743823 (2017 May 30)

(Patent Document 2) Korean Patent Publication No. 10-1775526 (2017 Aug. 31)

SUMMARY OF THE DISCLOSURE

An object of the present invention is to provide a frequency selective security paper including a meandering line or a frequency resonator of a capacitor so that a nation or a company may select and use a unique frequency paper suitable therefor in order to maintain the full security of a security paper, and a manufacturing method of the security paper.

According to an exemplary embodiment of the present invention, a frequency selective security paper includes: a drafting paper for forming a paper; a frequency resonator formed on one surface of the drafting paper and formed in a form of a meandering line or a capacitor so as to resonate to a designated frequency when passing through a security search device; and a coating liquid including the frequency resonator therein and formed on the drafting paper.

The meandering line or the capacitor of the frequency resonator may be formed by printing with a conductive ink.

The frequency resonator may adopt the conductive ink including a conductive nano metal, and water of a reference value or more as a solvent.

The frequency resonator may be formed to reflect a radio wave having a frequency designated according to a vertical or horizontal length of the meandering line.

The frequency resonator may be formed to reflect a radio wave having a frequency designated according to a size of the capacitor or a length of an inductor line connected to the capacitor.

The frequency resonator may form an LC frequency resonator including the capacitor.

The frequency resonator may be formed at an edge area of the drafting paper.

In the frequency resonator, the vertical or horizontal length of the meandering line or the size of the capacitor may be formed differently for each user so as for each user of a national institution or a company to have a unique frequency paper.

Further, according to another exemplary embodiment of the present invention, a manufacturing method of a frequency selective security paper includes: preparing for a drafting paper for forming a paper; forming a frequency resonator formed in a form of a meandering line or a capacitor on one surface of the drafting paper so as to resonate to a designated frequency when passing through a security search device; and including the frequency resonator therein and forming a coating liquid on the drafting paper.

In the forming of the frequency resonator, the meandering line or the capacitor of the frequency resonator may be formed by printing with a conductive ink.

In the forming of the frequency resonator, the conductive ink, which includes a conductive nano metal such as silver (Ag) or copper (Cu), and water of a reference value or more as a solvent, may be used.

In the forming of the frequency resonator, a radio wave having a frequency designated according to a vertical or horizontal length of the meandering line may be formed to be reflected.

In the forming of the frequency resonator, a radio wave having a frequency designated according to a size of the capacitor or a length of an inductor line connected to the capacitor may be formed to be reflected.

In the forming of the frequency resonator, an LC frequency resonator including the capacitor may be formed.

In the forming of the frequency resonator, the frequency resonator may be formed at an edge area of the drafting paper.

In the forming of the frequency resonator, the vertical or horizontal length of the meandering line or the size of the capacitor may be formed differently for each user so as for each user of a national institution or a company to have a unique frequency paper.

According to an exemplary embodiment of the present invention, nations or companies select and use a unique frequency paper suitable therefor to fully maintain a security.

Further, according to an exemplary embodiment of the present invention, a security paper, which is divided into hundreds or thousands of channels, can be supplied while maintaining manufacturing cost at a reasonable price.

DETAILED DESCRIPTION

Hereinafter, exemplary embodiments of the present invention will be described in detail with reference to the drawings. However, in the description of the present invention, if the technical spirit of the present invention is blurred or obscure due to a specific explanation of a known configuration, the description of the known configuration will be omitted.

Figure 1:
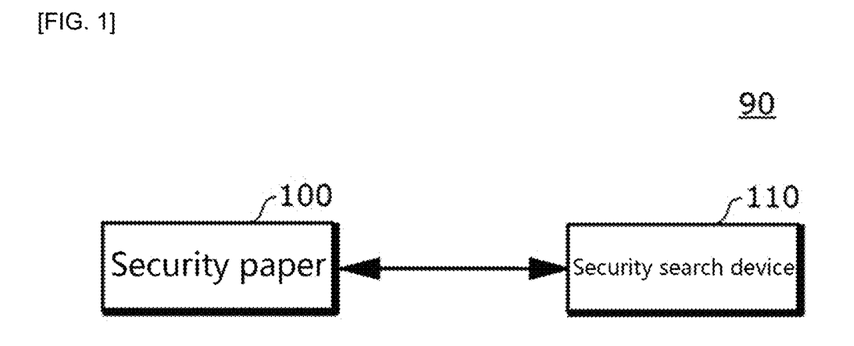
FIG. 1 is a diagram illustrating a security search system of a security paper according to an exemplary embodiment of the present invention.
Figure 2:
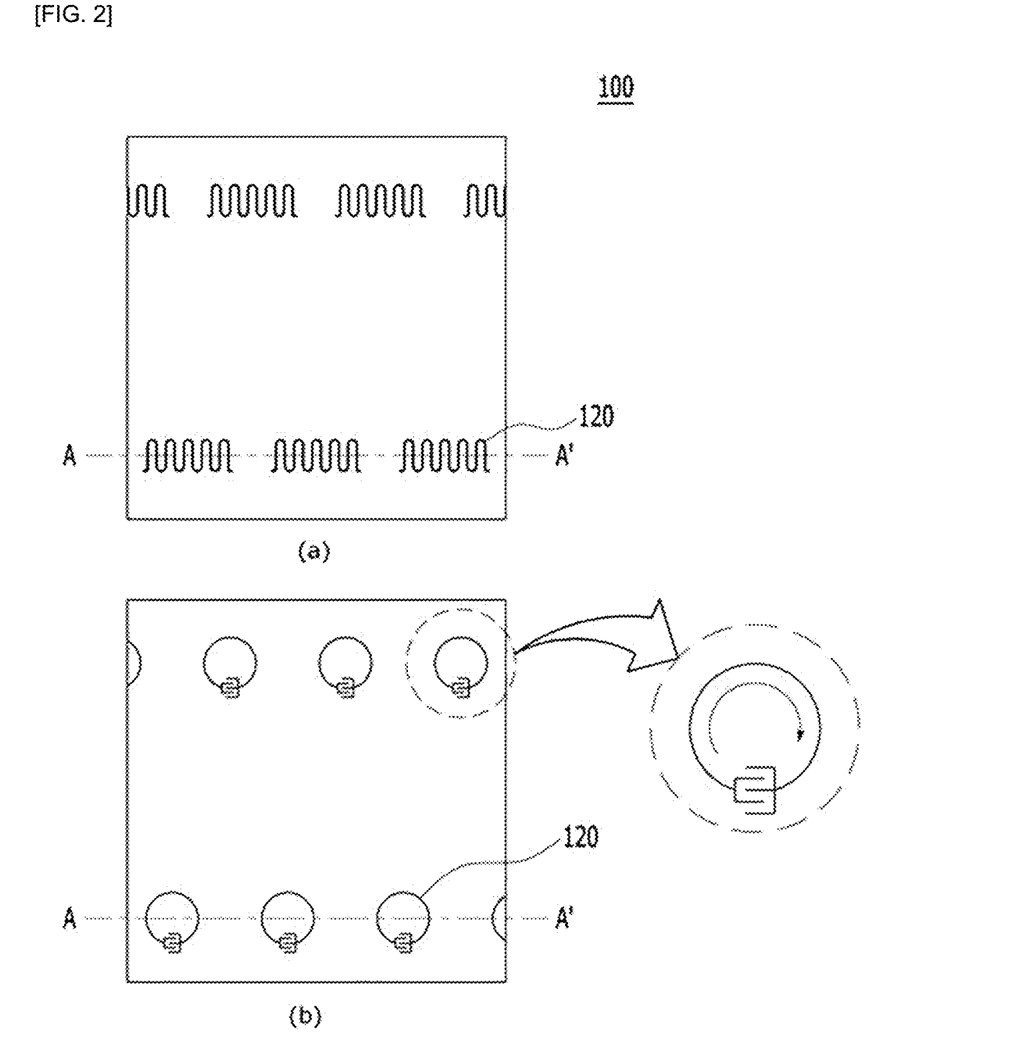
FIG. 2 is a diagram illustrating a forming example of a frequency resonator in the security paper of FIG. 1.
Figure 3:
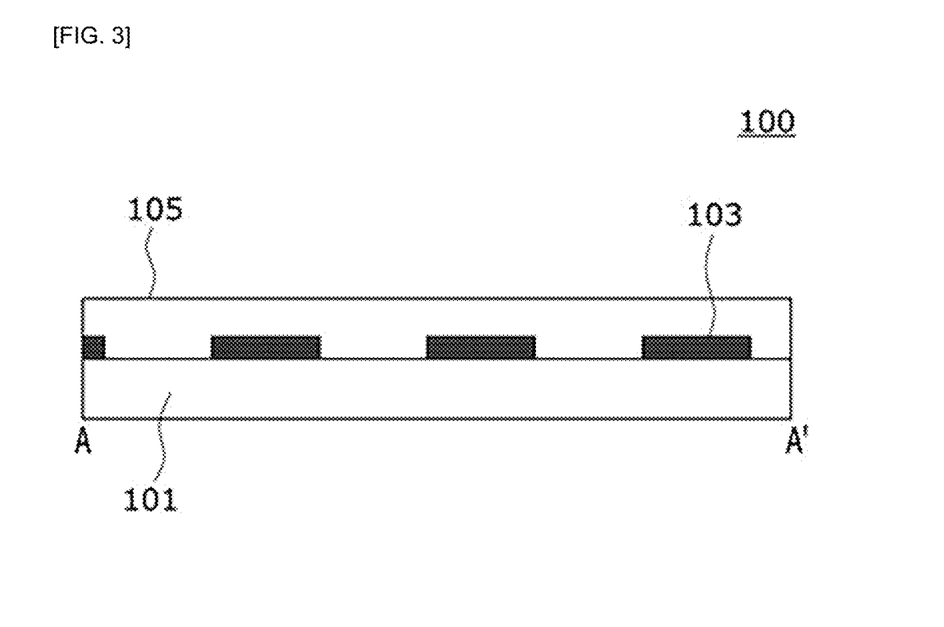
FIG. 3 is a cross-sectional view of the security paper viewed along a cutting line A-A' of FIG. 2.

FIG. 1 is a diagram illustrating a security search system of a security paper according to an exemplary embodiment of the present invention, FIG. 2 is a diagram illustrating a forming example of a frequency resonator in the security paper of FIG. 1, and FIG. 3 is a cross-sectional view of the security paper viewed along a cutting line A-A' of FIG. 2.

As illustrated in FIG. 1, the security search system 90 of a security paper according to an exemplary embodiment of the present invention includes a (frequency selective) security paper 100 and a security search device 110.

The security paper 100 according to an exemplary embodiment of the present invention includes a frequency resonator 120 therein when manufacturing a paper, and the frequency resonator 120 may include a meandering line frequency resonator or LC frequency resonator as in FIG. 2A. Of course, here, LC means an inductor L and a capacitor C. In other words, the LC frequency resonator is a frequency resonator of a type in which the inductor and the capacitor are combined.

The frequency resonator 120 in the security paper 100 according to an exemplary embodiment of the present invention does not appear to be exposed to the outside, and most of all, a specific frequency of the security paper 100 is read by the security search device 110 of FIG. 1, and thus it is possible to identify an owner of the security paper 100. The reason is that in the case of the security paper 100, the frequency resonator 120 is generated and supplied only for a specific owner. For example, it may be possible for a nation or a company to own the frequency resonator 120 of the meandering line by manufacturing the security paper 100 having a unique frequency suitable therefor in any degree. Therefore, if the nation uses a security paper 100 having a first unique frequency, Company A uses a security paper 100 having a second unique frequency, thereby completely preparing for a security by forming the frequency resonator 120 differently according to a user subject who intends to use the security paper 100.

As illustrated in FIG. 2, the frequency resonator 120 formed in the security paper 100 may be configured in a form in which the meandering line is formed at an edge of the security paper 100, or the LC of the LC frequency resonator including the capacitor is formed as the edge of the security paper 100. Of course, the frequency resonators 120 may have an interval to be constituted by one or more frequency resonators. Of course, the interval may be constant, and the intervals may be formed differently from each other. Since the constant interval may also be used for identifying the owner of the security paper 100, the interval will not be particularly limited to any one scheme in the exemplary embodiment of the present invention.

The security paper 100 according to the exemplary embodiment of the present invention as a frequency selective security paper capable of selecting a frequency includes some or all of a drafting paper 101, a conductive ink (layer) 103 forming the frequency resonator 120, and a coating liquid (layer) 105. Here, "include some or all" means that the security paper 100 may be configured by omitting some components or integrating some components into other components, which will be described as including all to help sufficient understanding of the invention.

The security paper 100 is manufactured through processes such as drying, cutting, and packaging after applying the prepared coating liquid 105 to the drafting paper 101 rolled in a roll form (for example, while slowly unrolling the drafting paper 101). For example, the meandering line of the conductive ink 103 forming the frequency resonator 120 is formed on the drafting paper 101 by the conductive ink 103 before applying the coating liquid 105 among the processes, and is printed to reflect a radio wave having a specific frequency according to a vertical and/or horizontal length having a predetermined pattern, or the size of the capacitor to resonate to the frequency ($\lambda/4$), and this is sensed by a receiving device of the security search device 110. Here, the receiving device may become a signal detector, i.e., a frequency reader. In the exemplary embodiment of the present invention, in configuring a shape by the conductive ink 103 to resonate to a specific frequency, the meandering line frequency resonator and the LC frequency resonator are used to easily implement a resonance length. The frequency resonator 120 using the conductive ink 103 may form a meandering line or LC of a desired form by rolling the conductive ink 103 temporarily bonded to the roller to the drafting paper 101. When mass production is required, the conductive ink 103 is formed by printing or transferring the conductive ink 103 through a printing machine of a device (or equipment) such as a printer. The conductive ink 103 may also be named as the conductive ink.

Manufacturing of the conductive ink 103 according to the exemplary embodiment of the present invention may vary depending on a technician, but the manufacturing is preferably made according to published general matters. A composition of the conductive ink 103 is conductive nano metal such as silver (Ag) or copper (Cu), and a solvent is 60 to 90% water compared with the weight. Cosolvent has a range of 0 to 20%, and as a cosolvent, ethylene glycol, glycerin, diethylene glycol mono butyl ether, or 2-pyrrolidone are added, and a small amount of dispersing agent, such as Sannovco Dispersant 44S, other binders and leveling, is added. There are various types of conductive nano metals, but when a hiding power is considered in mass production and paper, Ag nano metal (or cu nano metal) which has comparatively excellent conductivity and is cheap is suitable.

The coating liquid 105 is configured as paint, adhesive, and additives.

The paint may include at least one of white pigments, calcium carbonate ($CaCO_3$), and silica ($SiO_2$).

The adhesive may be an acrylic resin, a polyvinyl alcohol resin, starch, starch derivatives or silicate soda, and may be 0 to 30% by weight based on the entire coating material. The additive may include a sizing agent, a filling agent, and a filling resistant, and may be 0 to 5% by weight based on the entire coating material, and may follow a coating liquid application reference of the paper manufacturing company, which is generalized when applying the coating liquid.

Even though there is only one full type meandering line on the security paper 100 upon printing, the meandering line is measured by the frequency reader, so the meandering line in which the shape is cut belong to one intact meandering line. Further, one or more full type of the meandering lines based on A4 paper are designed to have an interval. Contents related to an interval design will be described below in more detail.

Meanwhile, the security search device 110 may include a signal generator, a signal detector, an antenna, and a peripheral circuit such as a filter or an amplifier (e.g., OP amp) that removes noise of a signal or amplifies the signal, and may further include a control unit such as a CPU, an MPU, etc., for controlling an operation of the signal generator or the signal detector. Here, the signal detector may be named as the frequency reader. The security search device 110 transmits frequency signals (f1, f2, f3, . . . , fn) generated by the signal generator, i.e., radio wave signals, to a designated space or place through an antenna (e.g., MIMO antenna), and receives a signal reflected on the transmitted signal through the antenna and reads the signal by the signal detector, and analyzes characteristics of the signal to confirm the frequency of the security paper 100. The resonance may mean a phenomenon in which an object, i.e., the security paper 100 vibrates in a large amplitude at a specific frequency. The specific frequency becomes a natural frequency, and it can be seen that the security paper 100 has its own natural frequency. In the exemplary embodiment of the present invention, the frequency resonator 120 is formed in a VHF band of 30 to 300 MHz and a UHF band of 300 MHz to 3 GHz, and as a result, the signal detector, i.e., the frequency reader may measure a partial section in the frequency range.

For example, the security search device 110 according to the exemplary embodiment of the present invention may use a frequency signal of 70 to 2000 Hz. Accordingly, each subject, i.e., user who owns or uses the security paper 100 may be allowed to use the security paper 100 having the unique frequency, such as frequency A used for the security paper by the National Intelligence Agency, frequency B used for the security paper by Korean S company, and frequency C used for the security paper by a government office. Through this, it may be, in any degree, possible to find a person who passes through the security service device 110 such as the security gate (or inspection table) through the resonance frequency of the security paper 100. More accurately, an affiliation of the person who passes through the security service device 110 may also be known.

According to the configuration result, it may be possible to originally prevent a problem of purchasing the security paper 100 outside although it may, of course, be difficult to purchase the security paper 100, holding frequency blocking materials on both sides of the security paper 100 and entering the company, outputting information, and leaking technology security when leaving work.

Figure 4:
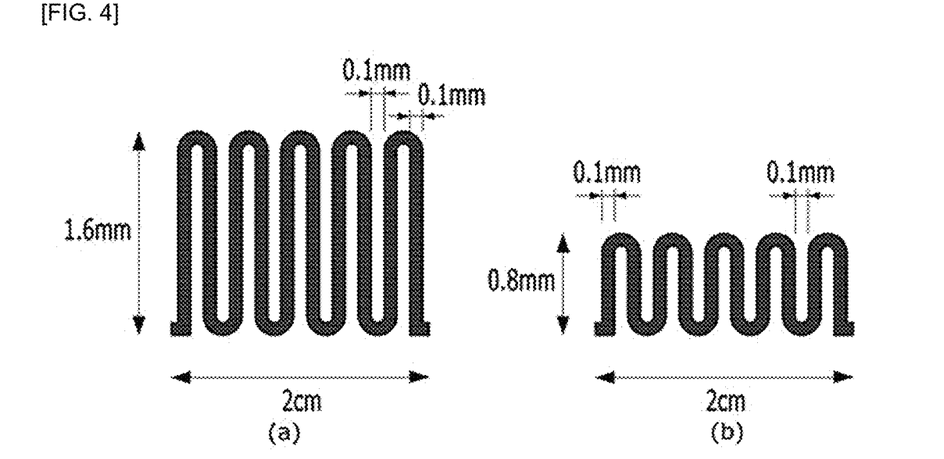
FIG. 4 is a diagram illustrating a modified example of a vertical length of a meandering line of FIG. 2.
Figure 5:
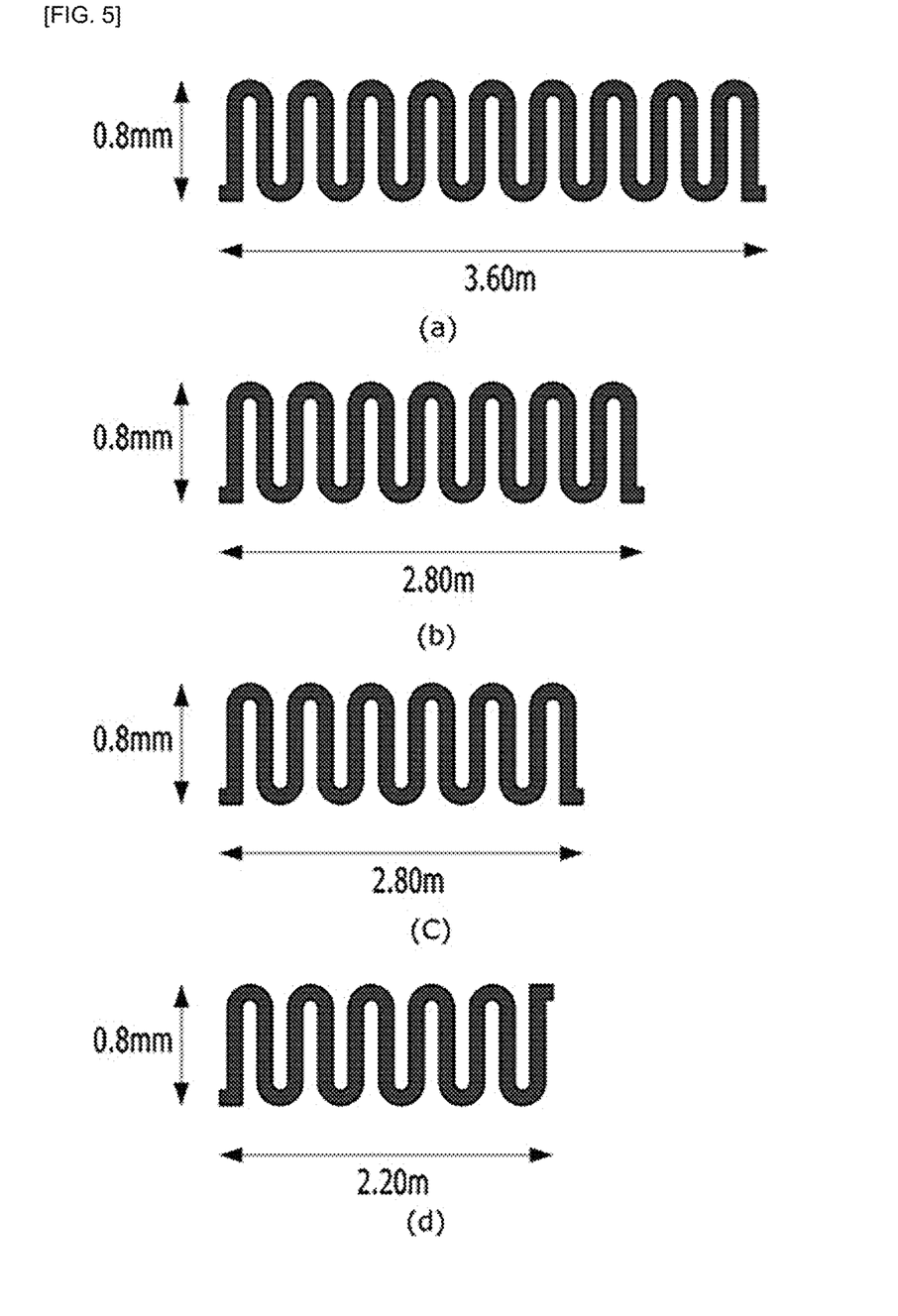
FIG. 5 is a diagram illustrating a modified example of a horizontal length of the meandering line of FIG. 2.
Figure 6:
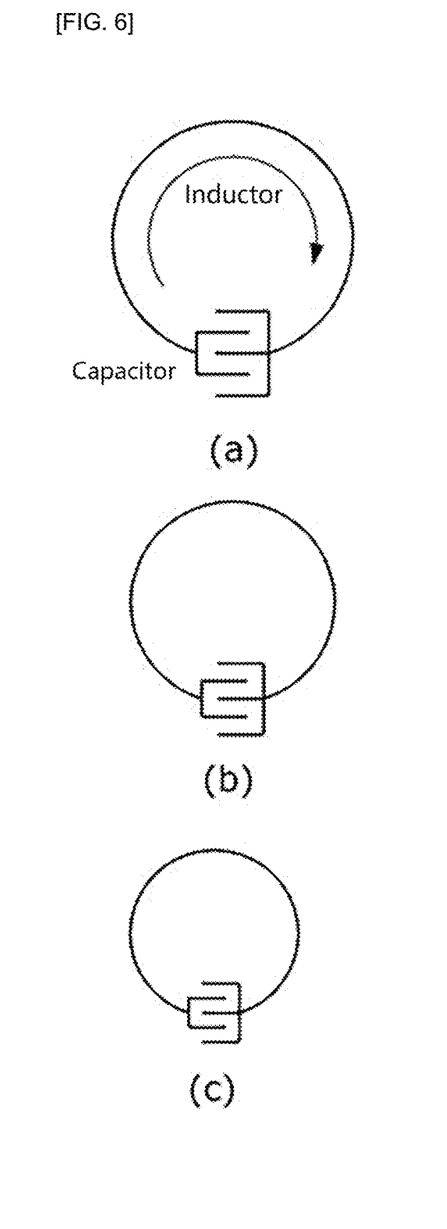
FIG. 6 is a diagram illustrating a forming example of an LC frequency resonator of FIG. 2.

FIG. 4 is a diagram illustrating a modified example of a vertical length of a meandering line of FIG. 2, FIG. 5 is a diagram illustrating a modified example of a horizontal length of the meandering line of FIG. 2, and FIG. 6 is a diagram illustrating a forming example of an LC frequency resonator of FIG. 2.

FIGS. 4A and 4B illustrate that (the frequency resonator 120) of the security paper 100 of FIG. 1 has different frequencies by controlling the vertical length of the meandering line. An actual size (e.g., based on A4 paper) may have a size which is two times larger than the sizes of FIGS. 4A and 4B. FIG. 4A illustrates the design of the meandering line corresponding to the UHF band of 900 MHz, and FIG. 4B illustrates a design state of the meandering line corresponding to the UHF band of 1800 MHz. As illustrated in FIGS. 4A and 4B, the meandering line may be formed within a range of 2 cm with respect to an X axis (horizontal length), and an interval between meandering lines in the Y-axis, i.e., vertical direction may be designed as 0.1 mm. However, in FIGS. 4A and 4B, the meandering line is formed as 1.6 mm in FIG. 4A, but formed to have a length of 0.8 mm in FIG. 4B, with respect to the Y axis (vertical direction). The frequency may be changed by controlling the vertical length.

Of course, the frequency resonator 120 using the meandering line according to the exemplary embodiment of the present invention may be commonly formed to have a length of 0.8 mm in a Y-axis (vertical) direction even in the meandering line corresponding to the UHF band of 1080 MHz as illustrated in FIG. 5. Of course, besides, the meandering line may be formed in various forms including 3.6 cm, 2.8 cm (e.g., UHF band of 1440 MHz), 2.4 cm (e.g., UHF band of 1620 MHz), 2.2 cm (e.g., UHF band of 1710 MHz), 2 cm (e.g., UHF band of 1800 MHz), etc., in an X-axis (horizontal) direction to manufacture the security paper 100 having the unique frequency. Of course, besides, the meandering line may be formed in more various forms including 3.4, 3.2, 3.0 (e.g., UHF band of 1350 MHz), 2.6 cm (e.g., UHF band of 1530 MHz), etc.

Meanwhile, in the security paper 100 of FIG. 1 according to the exemplary embodiment of the present invention, the LC frequency resonator may be formed as illustrated in FIG. 6 in addition to the meandering line illustrated in FIGS. 4 and 5, and at least one of the LCs may be differently formed as in FIG. 6 to change the frequency. For example, while the size of the capacitor is maintained to be the same, the size of the inductor is varied. Alternatively, it may also be, in any degree, possible that the size of the inductor is fixed and the size of the capacitor is varied. In the exemplary embodiment of the present invention, it is, in any degree, possible to form the unique frequency of the security paper 100 by controlling the size of at least one of the LCs, i.e., the size of an LC having a (metallic pattern) form, which is formed on the drafting paper 101 with the conductive ink 103.

According to the exemplary embodiment of the present invention, it is, in any degree, possible to manufacture the security paper 100 which is divided into approximately hundreds or thousands of channels according to the scheme described above. Of course, as the security search device 110, the security gate such as the inspection table is exemplified, but it is, in any degree, possible to discriminate who owns the security paper 100 by measuring the resonance frequency on the security paper 100 through the security search device 110 which is enabled to be carried, so the security search device 110 is not particularly limited in the exemplary embodiment of the present invention to preventing security data from being leaked outside through the security paper 100 in national institutions or companies. For example, frequency information of the security paper 100 for each user is prestored in the security search device 110, and then compared with a frequency discriminated through the frequency reader, and when both frequencies coincide with each other, user information (e.g., the National Intelligence Service, S company, etc.) may also be notified through a monitor screen. Therefore, it is possible to take an appropriate measure by checking an identification card of the user who passes through a search table.

Figure 7:
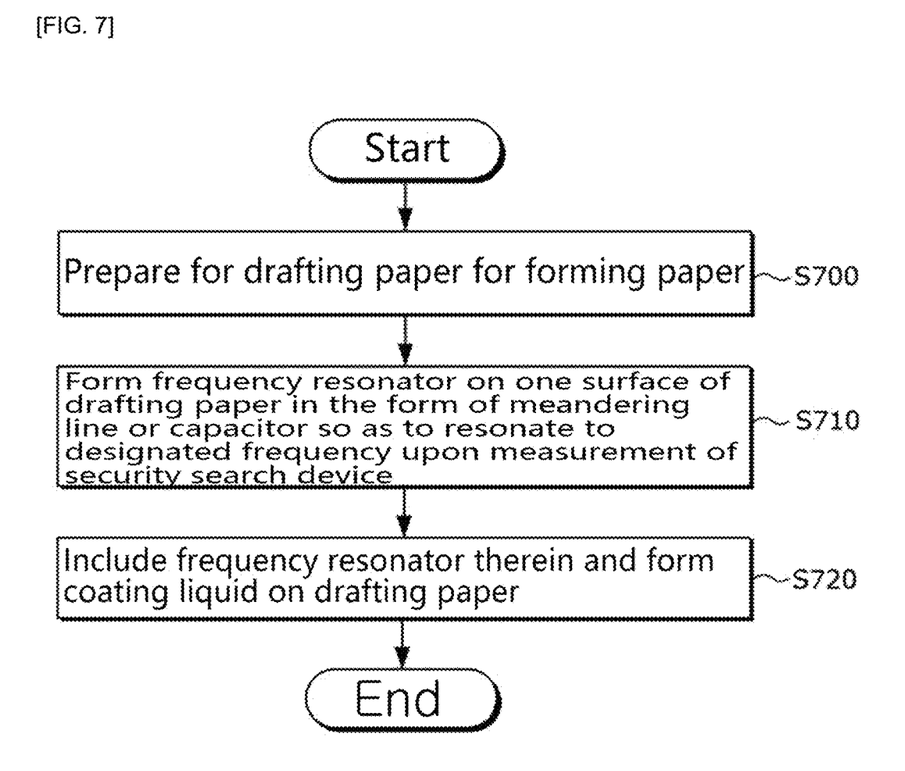
FIG. 7 is a flowchart illustrating a manufacturing process of the security paper of FIG. 1.

FIG. 7 is a flowchart illustrating a manufacturing process of the security paper of FIG. 1.

For convenience of description, referring to FIG. 7 together with FIG. 3, in the (frequency selective) security paper 100 according to the exemplary embodiment of the present invention, a drafting paper 101 for forming a paper is prepared (S700). In the case of mass production of the drafting paper, the drafting paper may be prepared in a form in which the drafting paper is rolled in a roller configured at one side of the equipment such as the printing machine such as the printer. The rolled drafting paper 101 may have a form in which a width and a length are several times larger based on the A4 paper.

Further, in the security paper 100, a meandering line or the capacitor type frequency resonator 120 which resonates to a designated frequency is formed on one surface of the drafting paper 101 upon measurement in the security search device 110 of FIG. 1 (S710). More accurately, a conductive ink (layer) 103 is formed to form at least one frequency resonator 120. When the drafting paper 101 is supplied through the roller as above, the frequency resonator 120 transfers the conductive ink 103 having a specific frequency onto the drafting paper 101 through the printer to form the security paper 100 having the unique frequency.

For example, unique frequencies used by customer A and customer B are different. Therefore, a manager controls the unique frequency through the printing machine according to a request of a customer and forms the conductive ink 103 corresponding to the unique frequency on the drafting paper 101 to generate the frequency selective security paper 100. For example, buttons having various types of unique frequencies may be displayed on a monitor of the printing machine, and the manager selects a specific button, so a pattern for forming a conductive ink 103 or a frequency resonator 120 having a unique frequency matching the specific button may be transferred to the drafting paper 101.

For example, it is assumed that a mask is used to transfer to the conductive ink 103 to the drafting paper 101. Of course, the mask may also be constituted by an opened portion and a closed portion. In this case, in the exemplary embodiment of the present invention, when there is the request of the customer, a transfer pattern of the conductive ink 103 having the unique frequency is changed through replacement of the mask to form a frequency resonator 120 having a frequency desired by the customer on the drafting paper 101. Of course, the frequency resonator 120 may be variously formed according to the request of the customer, which is not particularly limited to any one method in the exemplary embodiment of the present invention.

Further, the security paper 100 is completed by including frequency resonator 120 therein and forming the coating liquid (layer) 105 on the drafting paper 101 (S720). Of course, the coating liquid 105 may be formed and used by putting starch and additives into white pigments or calcium carbonate, and adding and agitating a soft magnetic metal powder at an appropriate ratio. Detailed contents are sufficiently described as above, so the contents related to the coating liquid 105 are intended to be replaced with the above contents.

Even after the processing of the coating liquid 105, processes of drying, cutting, and packaging the applied coating liquid 105 may be additionally performed in order to manufacture the security paper 100. Since this may be the same as or similar to the manufacturing process of the security paper 100 in the related art, this is intended to be replaced with the contents thereof.

In addition to the above contents, the security paper 100 according to the exemplary embodiment of the present invention may be formed in various schemes, and other detailed contents are sufficiently described above, so the corresponding contents are intended to be replaced with the contents thereof.

Hereinbefore, the specific exemplary embodiment of the present invention has been described in detail with reference to the drawings, but the exemplary embodiment is only an example for making the present invention easy to understand, so if it is apparent to those skilled in the art that various modifications of the exemplary embodiment can be made within the scope of the technical spirit of the present invention. Therefore, the modified examples will be said to belong to the claims of the present invention as described in the claims.

What is claimed is:

1. A frequency selective security paper, comprising:
   a drafting paper for forming a paper;
   a frequency resonator formed on one surface of the drafting paper and formed in a form of a capacitor so as to resonate to a designated frequency when passing through a security search device; and
   a coating liquid including the frequency resonator therein and formed on the drafting paper,
   wherein the capacitor of the frequency resonator is formed by printing only one surface of the drafting paper with a conductive ink, and both metallic patterns at one side and the other side of the capacitor are formed in contact with one surface of the drafting paper,
   the frequency resonator adopts the conductive ink including a conductive nano metal such as silver (Ag) or copper (Cu), and water of a reference value or more as a solvent, and
   the capacitor of the frequency resonator is formed in a form in which two 'C' shaped metallic patterns are connected to a circular inductor L formed on one surface of the drafting paper, and the 'C'-shaped metallic pattern at one side and the 'C'-shaped metallic pattern at the other side have different sizes.

2. The frequency selective security paper of claim 1, wherein the frequency resonator is formed to reflect a radio wave having a frequency designated according to a size of the capacitor or a length of an inductor line connected to the capacitor.

3. The frequency selective security paper of claim 1, wherein the frequency resonator forms an LC frequency resonator including the capacitor.

4. The frequency selective security paper of claim 1, wherein the frequency resonator is formed at an edge area of the drafting paper.

5. The frequency selective security paper of claim 1, wherein in the frequency resonator, the size of the capacitor is formed differently for each user so as for each user of a national institution or a company to have a unique frequency paper.

6. A manufacturing method of a frequency selective security paper, comprising:
   preparing for a drafting paper for forming a paper;
   forming a frequency resonator in a form of a capacitor on one surface of the drafting paper so as to resonate to a designated frequency when passing through a security search device; and
   including the frequency resonator therein and forming a coating liquid on the drafting paper,
   wherein in the forming of the frequency resonator, the capacitor of the frequency resonator is formed by printing only one surface of the drafting paper with a conductive ink, and both metallic patterns at one side and the other side of the capacitor are formed in contact with one surface of the drafting paper,
   in the forming of the frequency resonator, the conductive ink is used which includes a conductive nano metal such as silver (Ag) or copper (Cu), and water of a reference value or more as a solvent, and
   the capacitor of the frequency resonator is formed in a form in which two 'C' shaped metallic patterns are connected to a circular inductor L formed on one surface of the drafting maker, and the 'C'-shaped metallic pattern at one side and the 'C'-shaped metallic pattern at the other side have different sizes.

7. The manufacturing method of a frequency selective security paper of claim 6, wherein in the forming of the frequency resonator, the size of the capacitor is formed differently for each user so as for each user of a national institution or a company to have a unique frequency paper.

* * * * *